United States Patent [19]
Seng

[11] Patent Number: 5,940,566
[45] Date of Patent: Aug. 17, 1999

[54] 3D ARRAY OPTICAL DISPLACEMENT SENSOR AND METHOD USING SAME

[75] Inventor: Toh Peng Seng, Singapore, Singapore

[73] Assignee: Hewlett-Packard Company, Palo Alto, Calif.

[21] Appl. No.: 08/956,713

[22] Filed: Oct. 23, 1997

[51] Int. Cl.[6] ............................. G02B 6/00; G02B 6/06

[52] U.S. Cl. ........................ 385/116; 385/12; 385/115; 250/227.11; 250/227.2

[58] Field of Search ........................... 385/12, 115, 116; 250/227.21, 227.23, 227.11, 227.2

[56] References Cited

U.S. PATENT DOCUMENTS

| | | | |
|---|---|---|---|
| 5,200,819 | 4/1993 | Nudelman et al. | 358/98 |
| 5,261,404 | 11/1993 | Mick et al. | 128/653.1 |
| 5,298,741 | 3/1994 | Walt et al. | 250/227.23 |
| 5,475,452 | 12/1995 | Kuhn et al. | 351/212 |

*Primary Examiner*—Brian Healy

[57] ABSTRACT

This is an invention related to an apparatus for non-contact displacement measurement over an area. The apparatus is suitable for a small dynamic range with extremely high sensitivity. The area of measurement can be reconfigured as image processing technique is employed. The sensor is small and light in size.

12 Claims, 6 Drawing Sheets

3D ARRAY OPTICAL DISPLACEMENT SENSOR AND METHOD USING SAME

FIELD OF INVENTION

The invention is related to an apparatus for non-contact displacement measurement over an area simultaneously using coherent imaging fiber bundle and image processing means.

BACKGROUND

Most of the non-contact displacement sensors available presently can only perform a single point measurement. The commonly used techniques include capacitive, inductive, magnetic and light reflection sensing. In the case of capacitive sensing, the electrical capacitance between a probe and a target is converted into a voltage output. The displacement between the probe and the target forms the dielectric thickness of the capacitor and hence changes in its thickness will change its electrical capacitance. The target is usually grounded for this type of displacement sensing in order to form a closed circuit. In magnetic displacement sensor, the magnetic field changes according to the air gap between the sensor head and the object.

Light reflection sensor is of the most commonly used sensor in which a light beam is transmitted and its reflection bouncing off the object is received and analysed. Displacement measurement is based on the interaction between the field of illumination of the transmitting fibers and the field of view of the receiving fibers. At contact, or zero gap, most of the light exiting the transmitting fibers is reflected directly back into those fibers. No light is provided to the receiving fibers and the output signal is "zero". As the probe to target displacement increase, increasing amounts of light are captured by the receiving fibers. This relationship will continue until the entire face of the receiving fiber is illuminated with reflected light. This point is called the "optical peak" and corresponds to the maximum voltage output. After the optical peak is reached, a continued increase in displacement will cause the diverging field of reflected light to exceed the field of view of the receiving fibers, producing a reversal in the output versus displacement signal relationship.

For greater standoff displacement measurement, the light sensing technique is not effective. A simple triangulation principle is used instead to calculate the displacement between the object and the transmitter. The light receiver is not a simple photodetector that converts the light level into voltage signal. Instead, a position sensitive device (PSD) is used to locate the center of the reflected light beam. The position of light beam is then used to calculate the displacement. The light source can be generated from a Light Emitting Diode (LED) or a Laser.

In order for a single point displacement sensor to obtain a complete surface profile, that is the 3D data of an object, the single point displacement sensor must be made to scan over the entire surface. The major disadvantage of performing scanning is the time taken is long. In addition, high precision mechanism are required for this type of setup.

There are optical methods that are capable of performing 3D measurement over an area without the need for point to point scanning. These methods are holographic interferometry, Moiré techniques and speckle photography. The holographic method requires the fabrication of hologram for each and every object. Similarly, the Moiré technique must begin with pre-fabricated diffraction gratings.

SUMMARY OF THE PRESENT INVENTION

The present invention is an apparatus capable of measuring the surface profile of an object in which a large number of 3D data of the object surface is collected simultaneously.

According to one object of the present invention, a coherent imaging fiber bundle is used to transmit and receive light. Each of the optic fiber within the coherent imaging fiber bundle is responsible for collecting the 3D data of a single point. As a large number of imaging fibers are being used, a corresponding large number of 3D points can be collected. One end, hereinafter known as the object end, of the coherent imaging fiber bundle is aimed at the object surface. The other end, known as the imaging end, of the coherent imaging fiber bundle is coated with anti-reflection coating and connected to a beam splitter. The end surface of the coherent imaging fiber bundle are polished to a very high degree of flatness. A uniform light source transmits light into the beam splitter and part of the light is reflected into the coherent imaging fiber bundle. Light will then passed through each of the fiber and exit at the object end. The transmitted light will be reflected by the objects surface and return back to the same fiber. The reflected light will follow the fiber and exit from the imaging end of the fiber bundle.

According to another object of the present invention, the reflected light will pass through the beam splitter and being relayed onto an imaging array sensor. A commonly used imaging array sensor is the CCD (Charge Coupled Device) sensor. A single fiber is imaged onto several CCD pixels. The intensity of the reflected light through the fiber and the beam splitter is analysed. The strength of the reflected light intensity with respect to that of the transmitted light is used to compute the displacement between the fiber object end and the object point where light is being reflected. Each of the fiber has a small numerical aperture so that it will not be susceptible to stray light. The imaging array sensor will be digitized and sent to the image processor for analysis. Image processing and analysis techniques are used to analyze the intensity image of the coherent imaging fiber bundle imaging end. A plurality of region-of-interests (ROI) are created to encompass the multiple fiber imaging ends. An ROI consists of several pixels is allocated to collect light from each fiber.

Computation such as the calculation of mean and medium are applied to each of the ROIs. Based on the principle of inverse square law which states that the intensity of the reflected light is inversely proportional to the distance between the source and the receiver. The strength of the reflected light also depends on the albedo of the surface. If the surface is highly shiny, i.e. reflective, then a large proportion of light will be reflected. According to the present invention, the object surface should be of the same material and hence identical albedo. By using image processing/analysis means, the area of interest on the object can be easily reconfigured. For example, certain region-of-interest on the image need not be computed if they fall outside the surface area of interest. Calibration means is carried out to determine the relationship between the reflected light intensity and the displacement for different type of materials. Calibration results are stored in a Look-Up-Table (LUT) that relate the reflected light intensity to the displacement. Computation is reduced with the use of the Look-Up-Table (LUT).

According to a further object of the present invention, the coherent imaging fiber bundle is capable of having different aspect ratio at its two ends. At the object end of the coherent imaging fiber bundle, the shape of the bundle is made to match the area of interest. While on the imaging end, the shape and the aspect ratio of the coherent imaging fiber bundle are made to match that of the image detector.

DESCRIPTIONS OF THE ACCOMPANIED DRAWINGS

FIG. 1 Different methods of displacement sensing.

FIG. 2 Principle of light reflection displacement sensing.

FIG. 3 Block diagram of the present invention.

FIG. 4 The plane and side views of the object end of the coherent imaging fiber bundle.

FIG. 5 Image processing on multiple region-of-interest (ROI) receiving images from each of the fibers.

FIG. 6 The plane and side views of a typical integrated circuit (IC) package.

FIG. 7 Lead coplanarity measurement of the integrated circuit package.

FIG. 8 Aspect ratio conversion to match the shape object and the image detector.

DESCRIPTION OF THE PREFERRED EMBODIMENT

Figure 1:
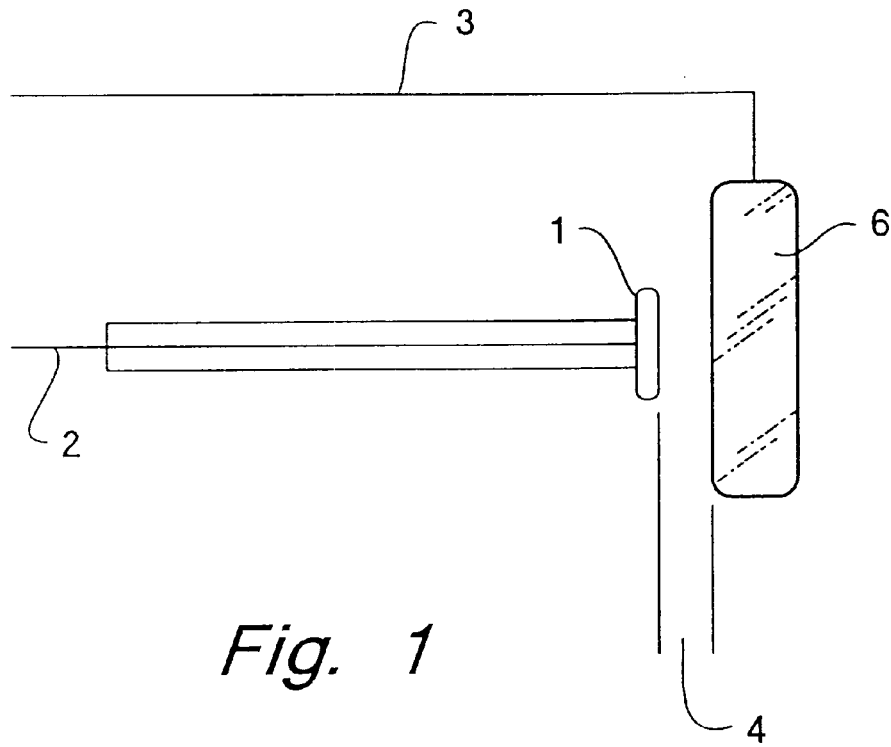
Figure 2:
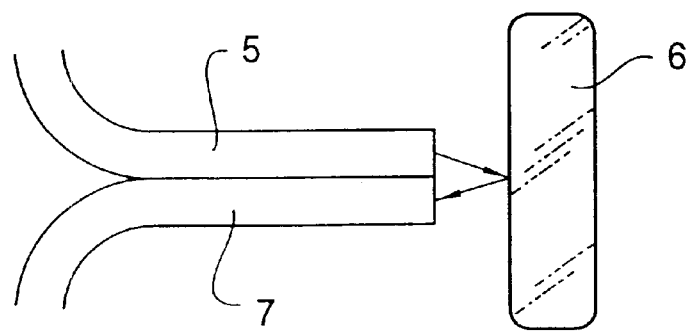
Figure 3:
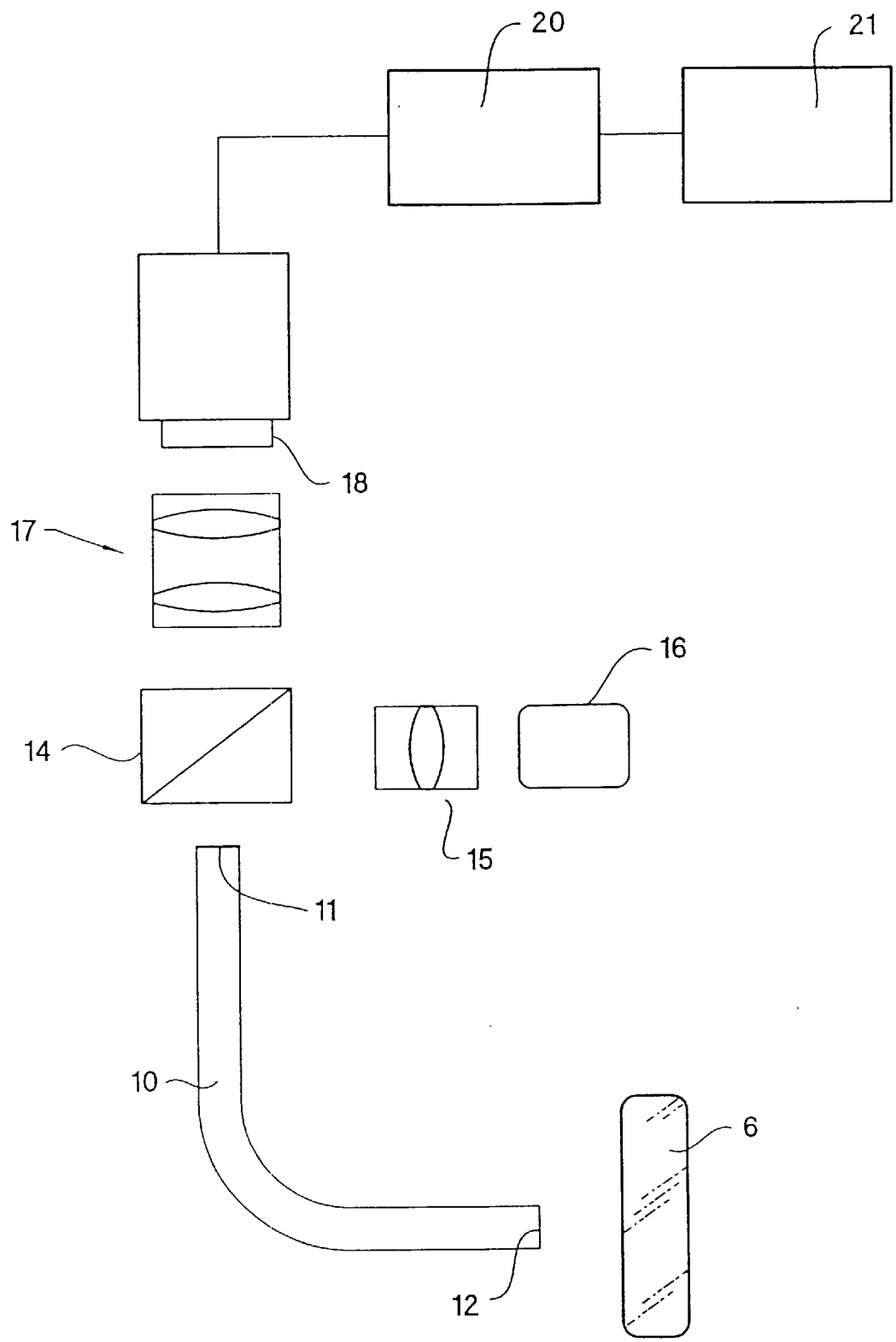
Figure 4:
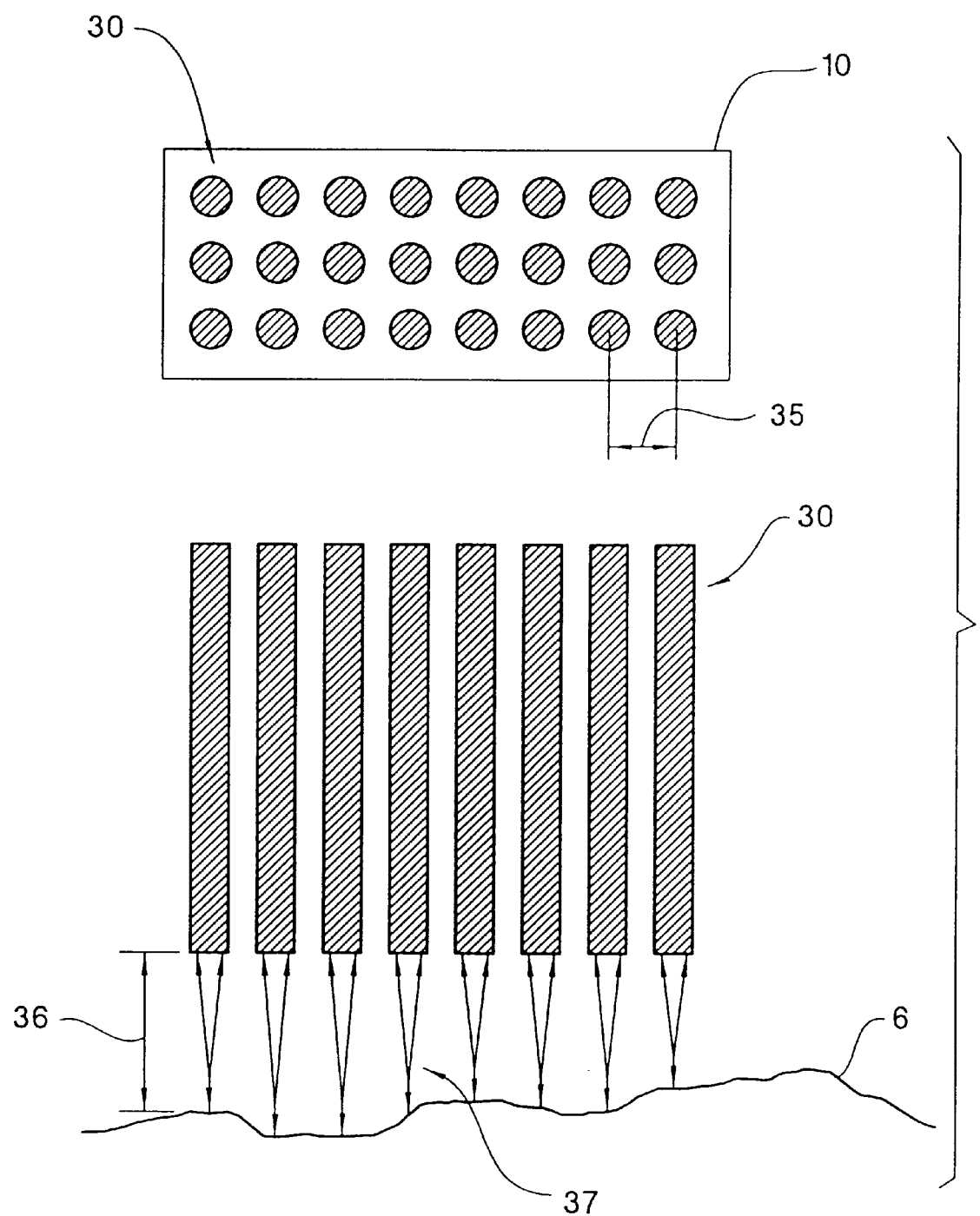
Figure 5:
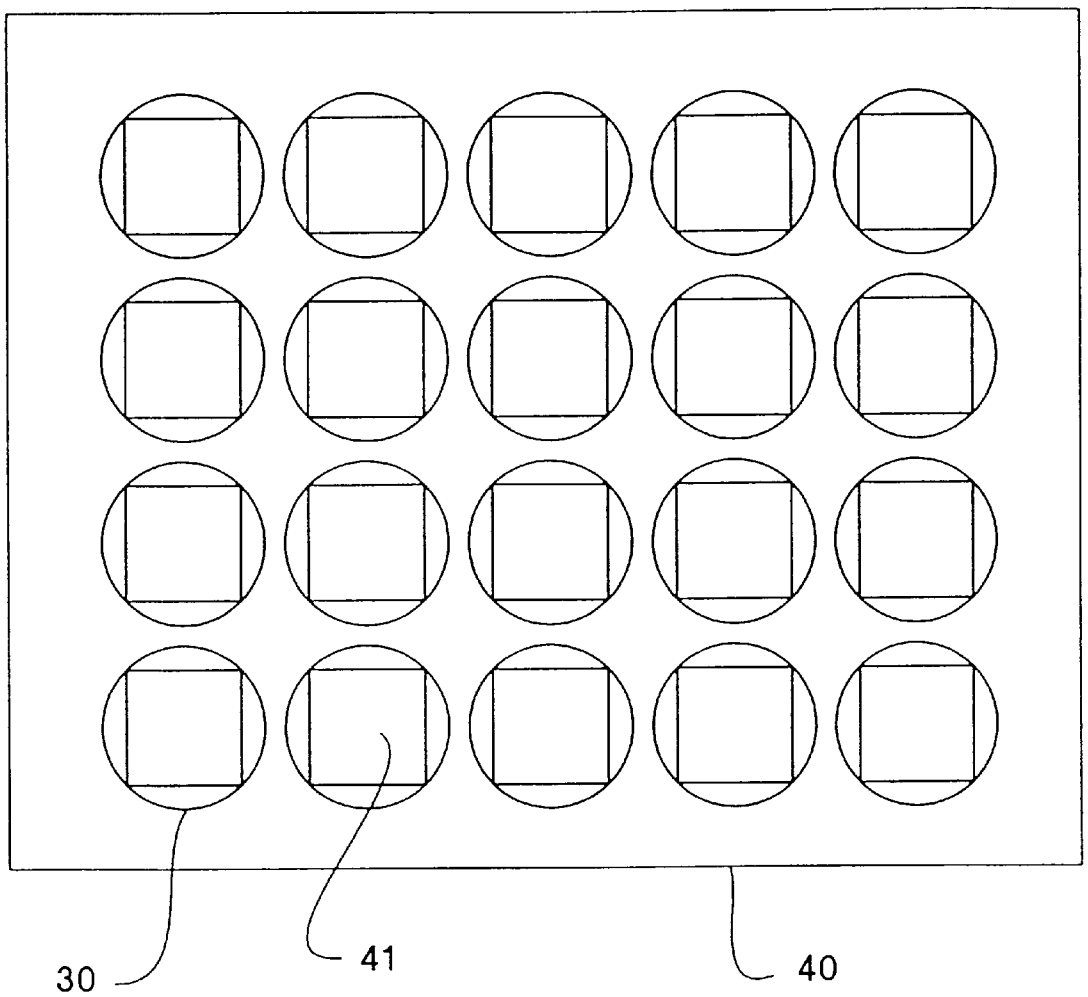
Figure 6A:
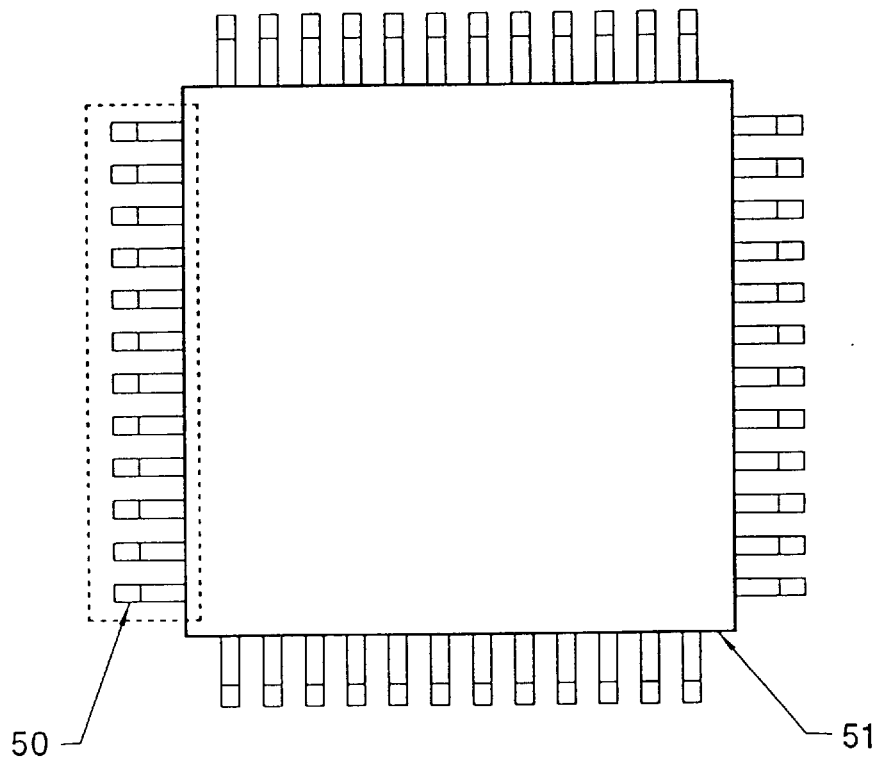
Figure 6B:
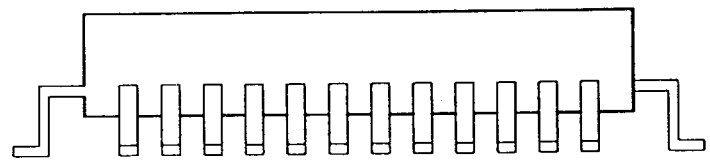
Figure 7:
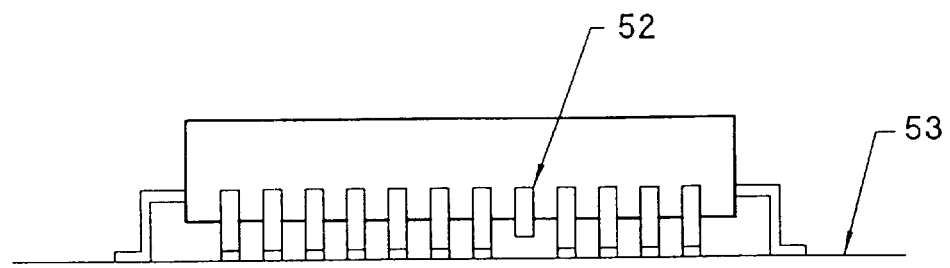

The present invention consists of a coherent imaging fiber bundle 10. One end of the coherent imaging fiber bundle is aimed squarely at the object surface 6 where 3D data is to be measured. This is known as the object end 12 of the coherent imaging fiber bundle 10. The other end which is the imaging end 11 of the coherent imaging fiber bundle 10, is connected to a beam splitter 14. One side of the beam splitter 14 is connected to a light source 16 through a collimator 15. The collimated light from the light source 5 and the collimator 16 emits uniformly onto the beam splitter 14 which is reflected into the coherent imaging fiber bundle 10. On one side of the beam splitter 14, which is opposite to the imaging end 11 of the coherent imaging fiber bundle 10, is a relay lens 17 that relays the image of the coherent imaging fiber bundle 10 into the image detector 18. The said image detector 18 is a CCD sensor in which a plurality of pixel elements collects the light from each of the fiber 30 within the coherent imaging fiber bundle 10. The image detector 18 is connected to a frame grabber 20 such that the video signal generated by the image detector 18 is digitized for subsequent image processing by the image processor 21.

The coherent imaging fiber bundle 10 consists of a plurality of fibers 30 arranged in a orderly manner capable of relaying images with minimum distortion. Each of the fiber 30 is responsible for the measurement of the displacement at one particular point on the object surface 6. The imaging end 11 of the coherent imaging fiber bundle 10 is coated with a layer of anti-reflection (AR) coating to prevent light from the light source reflecting into the image detector 18 directly. Only the reflected light from the object surface 6 is of interest in the measurement. The ambient lighting condition under which the present invention will operate is important. A very low ambient light level with respect to the light source 16 must be maintained. A light shield is used to control the ambient light level.

In the present invention, the reflected light 37 will pass through the beam splitter 14 and being relayed onto an imaging array detector 18. A commonly used imaging array sensor is the CCD (Charge Coupled Device) sensor. A single fiber 30 is imaged onto several CCD pixels. The intensity of the reflected light 37 through the fiber 30 and the beam splitter 14 is analysed. The strength of the reflected light intensity with respect to that of the transmitted light is used to compute the displacement 36 between the fiber object end 12 and the object point where light is being reflected. Each of the fiber 30 has a small numerical aperture so that it will not be susceptible to stray light. The imaging array detector 18 will be digitized by the frame grabber 20 and sent to the image processor 21 for image analysis. Image processing and analysis techniques are used to analyze the intensity image 40 of the coherent imaging fiber bundle imaging end 11. A plurality of region-of-interests (ROI) 41 are created to encompass the multiple fiber imaging ends 11. An ROI 41 consists of several pixels is allocated to collect light from each fiber 30.

The effective displacement range, Z, 36 of the present invention depends on the spatial resolution of the apparatus. The spatial resolution is controlled by the spacing 35 between adjacent fibers 30 as well as the numerical aperture of the fiber 30.

The mean and median of the intensity distribution in each of the ROIs are computed. Based on the principle of inverse square law which states that the intensity of the reflected light 37 is inversely proportional to the distance 36 between the source and the receiver. The intensity of the reflected light 37 also depends on the albedo of the object surface 6. If the surface is highly shiny, i.e. reflective, then a large proportion of light will be reflected. The present invention is applicable to object surface of the same material and hence identical albedo. By using image processing/analysis means, the ROIs on the image are applied only to the area of interest on the object and hence the area of measurement can be easily reconfigured to meet different requirement. Unlike a pure optical sensing means which is rigid, the present invention has the flexibility of meet a wide variety of requirement due to the image processing/analysis capability.

The accuracy of the present invention in measuring displacement depends on the dynamic range of the image detector and the image processor. If a 10-bit system is used, the effective displacement range Z, 36, will be divided into 1024 discrete steps. The displacement resolution is equal to Z/1024. In summary, the resolution is equal to $Z/2^n$, where n is the number of bit of the frame grabber and image processing system.

The intensity I which is the mean intensity of the ROI of the reflected beam 37 of a particular fiber 30 is related to the displacement Z as follows $$I = S P/Z^2$$

where S is the intensity of the transmitted light produced by the light source 16, P is the albedo of the object surface 6, and Z is the displacement 36. Given the situation that P is uniform across the entire surface of the object 6 where measurement is made, and S is also constant for all the individual fibers 30 in the coherent imaging fiber bundle 10, then I varies only with the displacement Z, S and P can be easily obtained by calibration using known displacement.

The nonlinear relationship between the intensity and the displacement can be linearised by the use of a Look-Up-Table (LUT). The content of the LUT is obtained empirically by the calibration process. The LUT effectively converts an input value to another value. Whenever a new object with unknown material is used, calibration is performed to obtain the values of S and P. The use of a LUT also eliminates the need for complex calculation which is time consuming.

The present invention can be best applied to the measurement of integrated circuit (IC) 51 lead geometry especially the coplanarity. Lead coplanarity is a measurement of the flatness of the all the leads 50 collectively. Ideally, all the leads 50 on an IC package 51 must sit on a common seating plane 53. In practice, some of the leads 50 such as lead 52 is shorter and deviated from the ideal seating plane 53. The degree of deviation is known as the coplanarity measure. The requirement on tight control of the IC package coplanarity is very stringent for high lead-count IC. The accuracy requirement must be better than 10 microns. The measurement speed must also be extremely fast.

Figure 8:
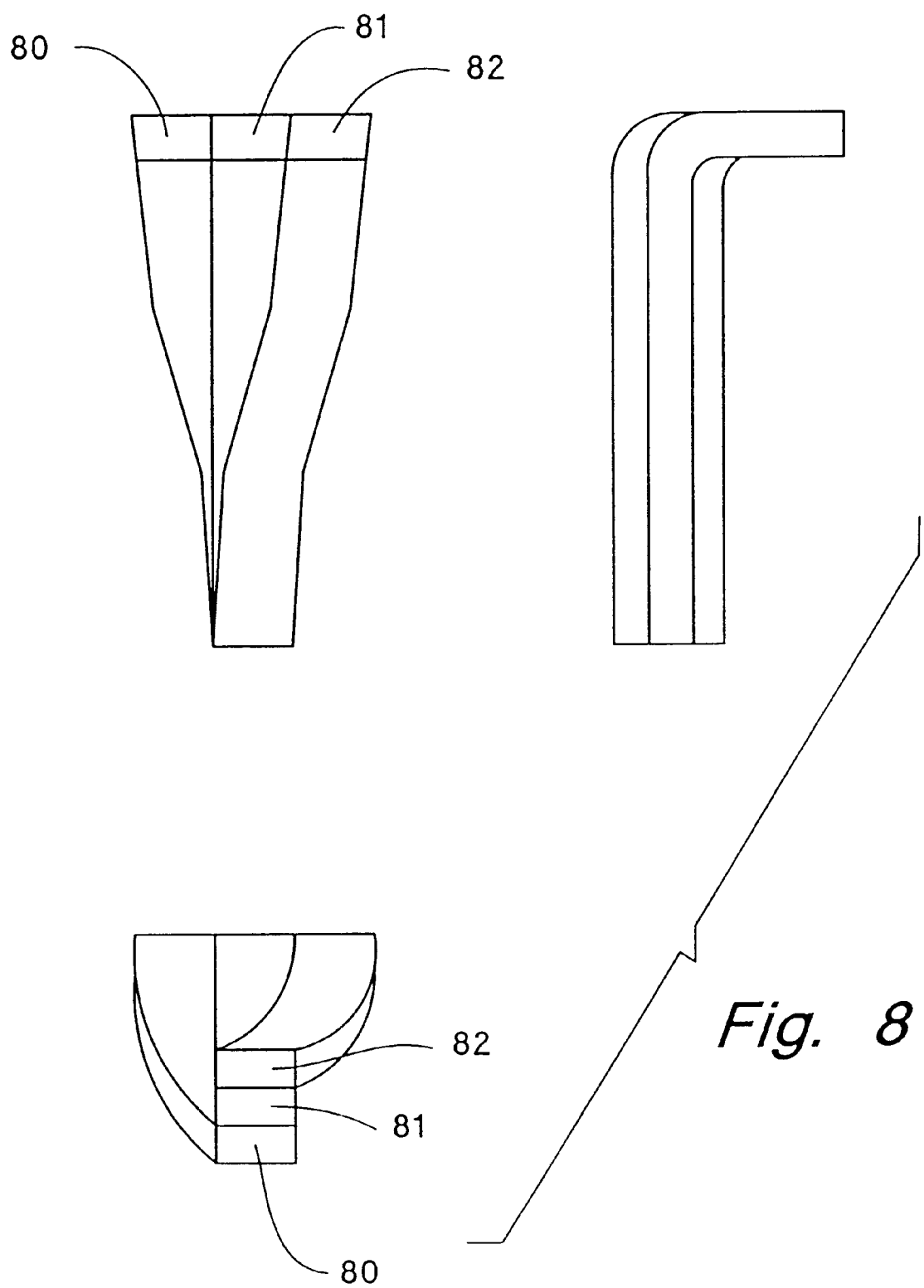

In using the present invention for IC lead geometry measurement, the object end 12 of the coherent imaging fiber bundle 10 is positioned below the leads 50 of an IC package 51. Taking all the leads 50 on one side of the IC 51, it can be seen that the enclosing rectangle 54 is oblong in shape. In other words, the rectangle 54 has a high aspect ratio. Aspect ratio is defined as the ratio between the length and the width of a rectangle. In the specific embodiment of the present invention, the high aspect ratio of the object end 12 is converted into an aspect ratio that best matched that of the image detector 18. This results in the maximization of the spatial resolution of the image detector 18. In one example as shown in FIG. 8, the coherent imaging fiber bundle 10 is divided into 3 sections 80, 81 and 82. On the Object end 2, the three sections 80, 81 & 82 are aligned length-wise. On the image end 11 of the coherent imaging fiber bundle 10, the three sections are stacked onto one another and aligned in a width-wise manner. In the example shown, the aspect ratio of the coherent imaging fiber bundle 10 at the object end is 12:1. At the image end 11, the aspect ratio is reduced to 4:3 which matches the aspect ratio of most commonly found image detector 18.

In the measurement of IC lead geometry using the present invention, there are multiple fibers located below each of the leads 50 on the IC 51. Multiple displacement measurements are taken for any one lead 50. By obtaining multiple displacement measurements on each of the lead, the three-dimensional profile of the lead is hence collected. On the other hand, there are fibers positioned below the gap in between two leads. No reflection of light will occur at the gap as there are no object within the effective displacement range. Using image processing means, ROIs are assigned to image areas where there are leads are expected. The mean intensity of the reflected light from each of the fibers is computed leading the derivation of displacement for each of the fibers. Further analysis can be taken to determined the coplanarity of the all the leads.

I claim:

1. The 3D array sensor is an apparatus for displacement measurement of multiple spots over an area concurrently, the 3D array sensor comprising a coherent imaging fiber bundle having a plurality of fibers arranged in an orderly manner, a beam splitter, a uniform light source, an image detector, relay lens, a frame grabber and an image processor; the beam splitter is positioned in the center of the image detector, the uniform light source and the coherent imaging fiber bundle;

the said coherent imaging fiber bundle transmits light from the uniform light source to the object under measurement and collect the reflected light from the object to the image detector through the beam splitter;

the image acquired by the image detector is digitized by the frame grabber and processed by the image processor in which the displacement of a particular spot is related to the intensity of the corresponding region-of-interest on the image captured by the image detector.

2. The 3D array sensor as claimed in claim 1, the reflected light from the object surface is relayed by the coherent imaging fiber bundle to form an image on the image detector and image processing means is used to calculate the intensity of different areas on the image which correspond to the intensity of the different fibers.

3. The 3D array sensor as claimed in claim 2, the relationship between the reflected intensity and the displacement is obtained by calibration.

4. The 3D array sensor as claimed in claim 1, the coherent imaging fiber bundle can have different shapes and aspect ratio on its two ends to match the object area to the image detector.

5. The 3D array sensor as claimed in claim 4, the image end of the coherent imaging fiber bundle is coated with a layer of anti-reflection coating.

6. The 3D array sensor as claimed in claim 5, the ambient light is brought under control such that its intensity level is much lower than the transmitted light.

7. A method for determining coplanarity of surfaces, the method comprising the steps of:

illuminating the surfaces with light transmitted from a coherent fiber bundle;

capturing an image of albedos of the surfaces due to reflections of the light; and analyzing light intensities of the albedos to determine relative displacements of the surfaces.

8. A method for determining coplanarity of surfaces according to claim 7, wherein the step of illuminating the surfaces comprises illuminating each surface with light transmitted from a plurality of fibers in the coherent fiber bundle and the step of analyzing light intensities of the albedos to determine relative displacement of the surfaces comprises determining an average displacement of each surface using light intensities received by the plurality of fibers transmitting light on each surface.

9. A method for determining coplanarity of surfaces according to claim 7, wherein the step of analyzing light intensities comprises using a lookup table of calibrated values to determine the displacement of each of the surfaces.

10. A method for determining coplanarity of surfaces according to claim 7, wherein the step of illuminating the surfaces comprises illuminating the surfaces concurrently and wherein the step of capturing an image of albedos of the surfaces comprises capturing the albedos from the surfaces concurrently.

11. A method for determining coplanarity of surfaces of a group of legs of an integrated circuit package, the method comprising the steps of:

illuminating the surfaces of the group of legs with light transmitted from a coherent fiber bundle;

capturing an image of albedos of the surfaces;

analyzing light intensities of the albedos to determine relative displacements of the surfaces.

12. A method for determining coplanarity of surfaces of a group of legs of an integrated circuit package, the method comprising the steps of:

illuminating an area encompassing the surfaces of the group of legs with light transmitted from a coherent fiber bundle having a plurality of fibers;

capturing an image of the illuminated area;

distinguishing in the image, albedos of the surfaces due to reflected light; and analyzing light intensities of the albedos to determine relative displacements of the surfaces.

* * * * *